(12) United States Patent
Chang et al.

(10) Patent No.: US 9,741,665 B2
(45) Date of Patent: Aug. 22, 2017

(54) ALIGNMENT MARKS IN NON-STI ISOLATION FORMATION AND METHODS OF FORMING THE SAME

(71) Applicant: Taiwan Semiconductor Manufacturing Company, Ltd., Hsin-Chu (TW)

(72) Inventors: Chun-Wei Chang, Tainan (TW); Shyh-Fann Ting, Tainan (TW); Ching-Chun Wang, Tainan (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 6 days.

(21) Appl. No.: 15/089,856

(22) Filed: Apr. 4, 2016

(65) Prior Publication Data

US 2016/0218066 A1    Jul. 28, 2016

Related U.S. Application Data

(62) Division of application No. 14/157,720, filed on Jan. 17, 2014, now Pat. No. 9,305,822.

(51) Int. Cl.
| | |
|---|---|
| *H01L 23/544* | (2006.01) |
| *H01L 27/02* | (2006.01) |
| *H01L 21/308* | (2006.01) |
| *H01L 21/311* | (2006.01) |
| *H01L 21/8234* | (2006.01) |

(Continued)

(52) U.S. Cl.
CPC ........ *H01L 23/544* (2013.01); *H01L 21/0274* (2013.01); *H01L 21/0276* (2013.01); *H01L 21/308* (2013.01); *H01L 21/3065* (2013.01); *H01L 21/3085* (2013.01); *H01L 21/31111* (2013.01); *H01L 21/762* (2013.01); *H01L 21/823412* (2013.01); *H01L 21/823481* (2013.01); *H01L 27/0207* (2013.01); *H01L 29/0646* (2013.01); *H01L 29/78* (2013.01); *H01L 29/6659* (2013.01); *H01L 2223/5442* (2013.01); *H01L 2223/5446* (2013.01);

(Continued)

(58) Field of Classification Search
None
See application file for complete search history.

(56) References Cited

U.S. PATENT DOCUMENTS

2008/0014708 A1*   1/2008   Kim ............... H01L 21/76224
                                                    438/401
2009/0221148 A1    9/2009   Uda et al.

OTHER PUBLICATIONS

John Miller, Photolithography, Mar. 28, 1999.

* cited by examiner

*Primary Examiner* — Asok K Sarkar
(74) *Attorney, Agent, or Firm* — Slater Matsil, LLP

(57) ABSTRACT

A method includes forming a photo resist over a semiconductor substrate of a wafer, patterning the photo resist to form a first opening in the photo resist, and implanting the semiconductor substrate using the photo resist as an implantation mask. An implanted region is formed in the semiconductor substrate, wherein the implanted region is overlapped by the first opening. A coating layer is coated over the photo resist, wherein the coating layer includes a first portion in the first opening, and a second portion over the photo resist. A top surface of the first portion is lower than a top surface of the second portion. The coating layer, the photo resist, and the implanted region are etched to form a second opening in the implanted region.

20 Claims, 11 Drawing Sheets

(51) Int. Cl.
*H01L 21/027* (2006.01)
*H01L 21/762* (2006.01)
*H01L 21/3065* (2006.01)
*H01L 29/06* (2006.01)
*H01L 29/78* (2006.01)
*H01L 29/66* (2006.01)

(52) U.S. Cl.
CPC ............... *H01L 2223/54426* (2013.01); *H01L 2924/0002* (2013.01)

ALIGNMENT MARKS IN NON-STI ISOLATION FORMATION AND METHODS OF FORMING THE SAME

PRIORITY CLAIM AND CROSS-REFERENCE

This application is a divisional of U.S. patent application Ser. No. 14/157,720, entitled "Alignment Marks in Non-STI Isolation Formation and Methods of Forming the Same," filed on Jan. 17, 2014, which application is incorporated herein by reference.

BACKGROUND

In the manufacturing of integrated circuits, the sizes of integrated circuit devices are scaled down increasingly. For example, Complementary Metal-Oxide-Semiconductor (CMOS) Image Sensor (CIS) chips have increasingly smaller pixel sizes. Accordingly, the requirement in the DC and noise performance of the CIS chips becomes increasingly stricter. Conventional integrated circuit formation processes thus cannot meet the strict requirements of the CIS chips. For example, Shallow Trench Isolation (STI) regions were used to isolate devices. In the formation of the STI regions, the silicon substrate, in which the STI regions are formed, suffers from the damage caused by the formation of the STI regions. As a result, charges such as electrons are trapped at the interfaces between the STI regions and the silicon substrate. These charges cause background noise in the signals of the CIS chips.

To solve these problems, Device Isolation (DI) regions are formed to replace the conventional Shallow Trench Isolation (STI) regions to isolate devices. With the formation of the DI regions using implantation rather than STI regions, the damage to the surface of silicon substrate, which damage is caused by the formation of the STI regions, is eliminated.

The DI regions are formed by implanting an impurity to portions of a substrate, which portions surround the active regions of the integrate circuit devices that are to be isolated. The implanted impurity has the same conductivity type as the well regions in which the devices are formed. It is, however, difficult to control the accuracy in the overlay of the components of the integrated circuit devices with the DI regions. For example, the accuracy in the overlay between the DI regions and the overlying gate electrodes are difficult to control. In the situations in which the gate electrodes are misaligned to the DI regions, gate electrodes may not be able to fully separate the channel between the source and drain regions of the MOS devices formed at the DI regions. Leakage currents may occur between the source and drain regions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Alignment marks in Device Isolation (DI) regions and the methods of forming the same are provided in accordance with various exemplary embodiments. The intermediate stages of forming the alignment marks are illustrated. The variations of the embodiments are discussed. Throughout the various views and illustrative embodiments, like reference numbers are used to designate like elements.

Figure 1:
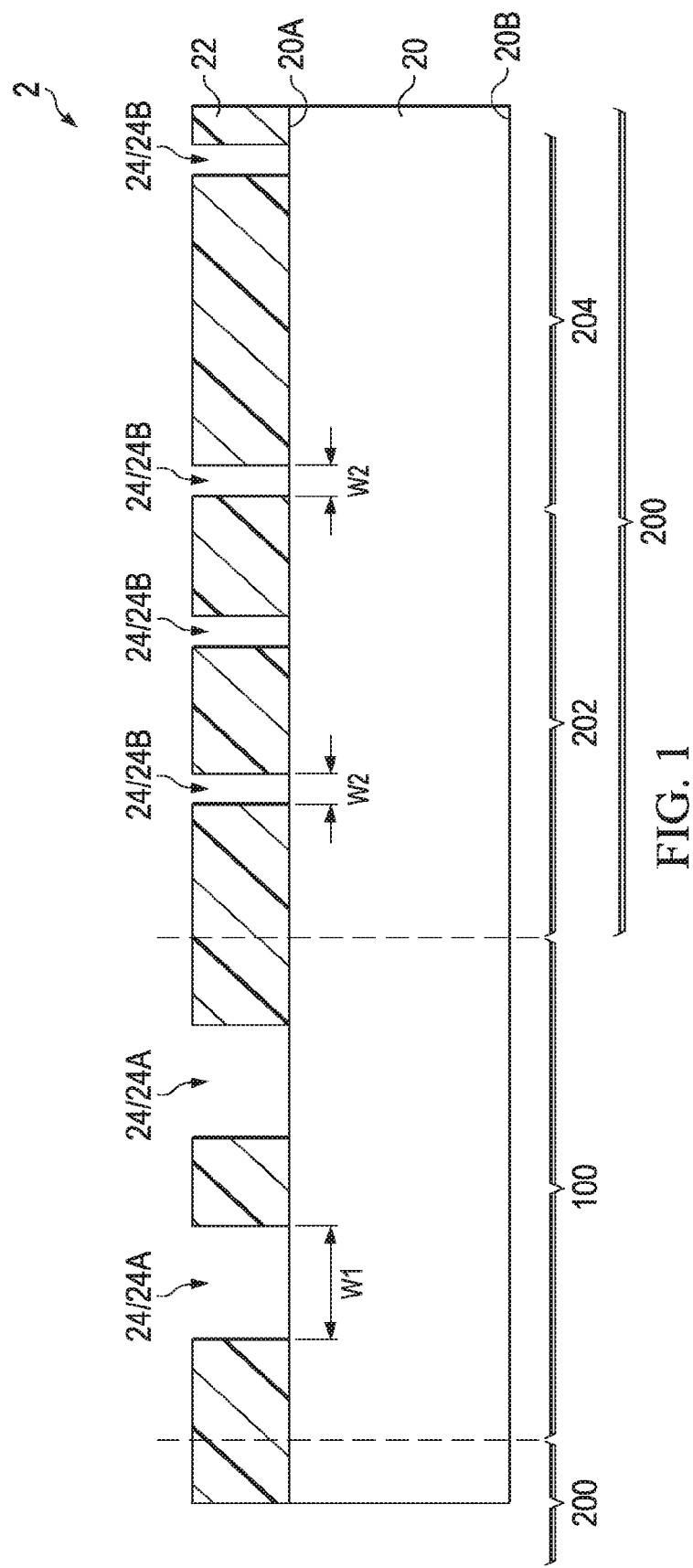
FIGS. 1 through 9 are cross-sectional views of intermediate stages in the manufacturing of alignment marks and a transistor in accordance with some exemplary embodiments.

Referring to FIG. 1, wafer 2, which includes semiconductor substrate 20, is provided. In some embodiments, semiconductor substrate 20 is a bulk silicon substrate. In alternative embodiments, semiconductor substrate 20 is formed of other semiconductor materials such as silicon carbon, silicon germanium, a III-V compound semiconductor material, or the like. Semiconductor substrate 20 may also be a Silicon-On-Insulator (SOI) substrate in some embodiments.

Figure 9:
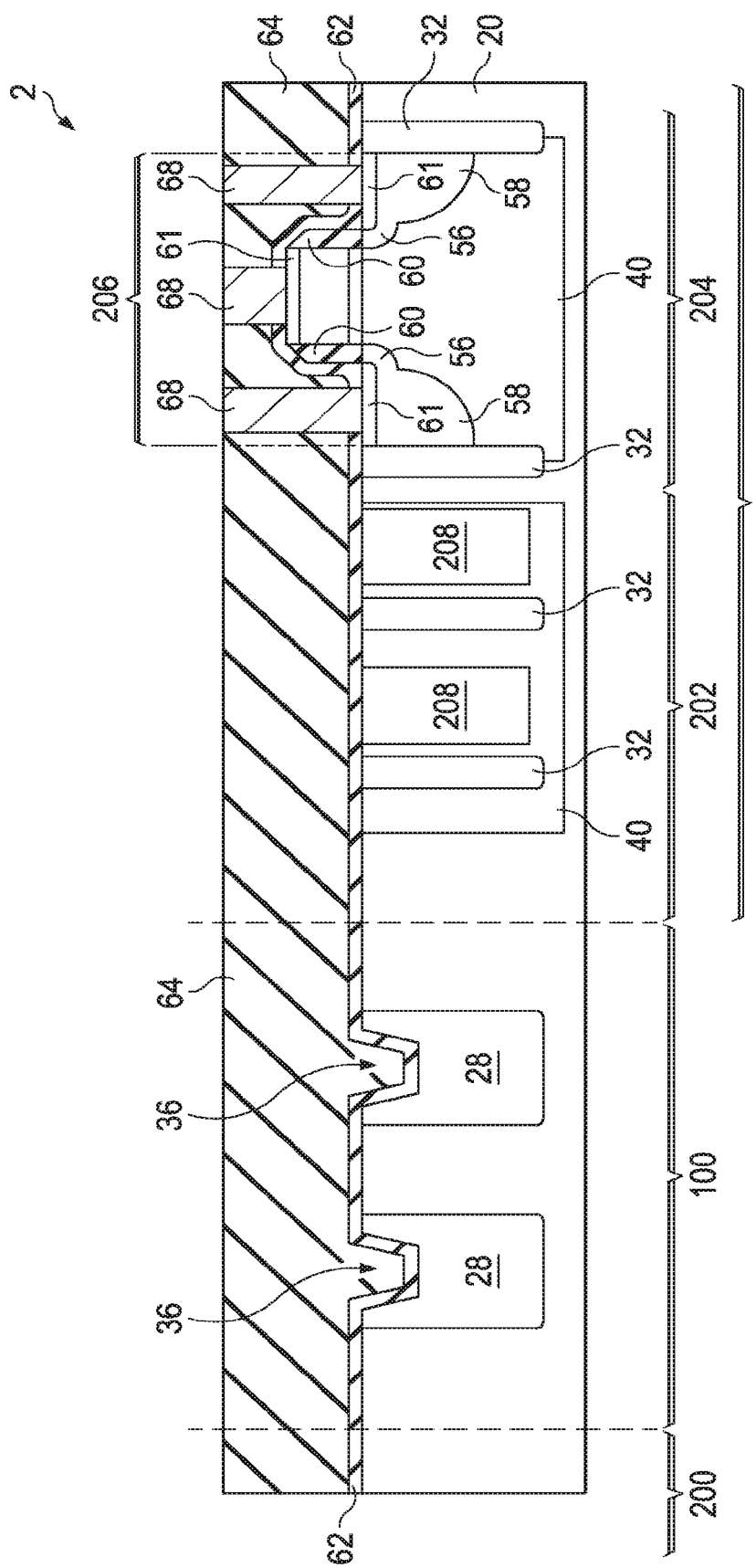
Figure 10:
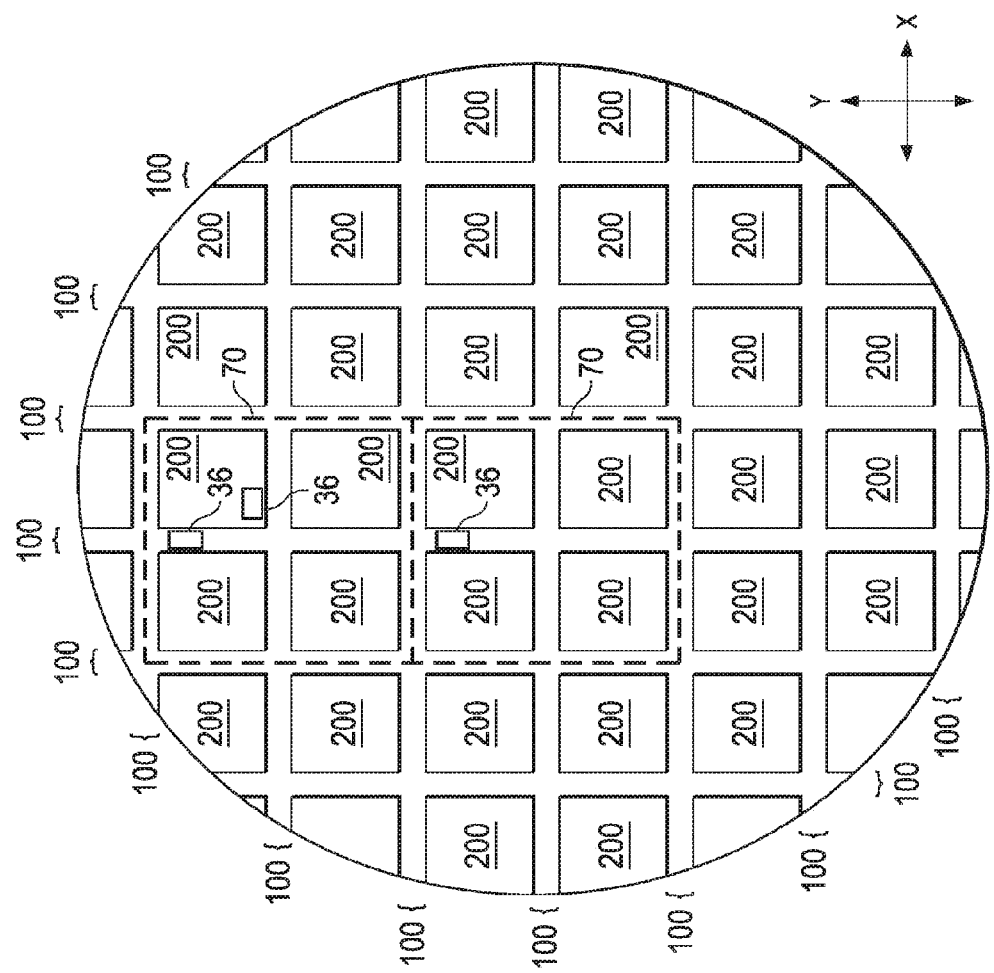
FIG. 10 illustrates a top view of a wafer including alignment marks formed in accordance with the exemplary embodiments of the present disclosure.

FIG. 10 illustrates a top view of wafer 2. Wafer 2 includes chips 200 aligned as rows and columns, and scribe lines 100 separating chips 200 in neighboring rows and columns from each other. Scribe lines 100 are used to saw chips 200 apart in the subsequent die-saw process. Chips 200 are used to form integrated circuit devices such as transistors 206 (FIG. 9), photo diodes 208, resistors (not shown), capacitors (not shown), and/or the like, therein.

Referring back to FIG. 1, semiconductor substrate 20 includes front surface 20A and back surface 20B. Throughout the description, the regions including scribe lines 100 and the overlying regions are referred to as scribe line regions, which are also denoted as 100, and the regions including chips 200 and the overlying regions are referred to as chip regions, which are also denoted as 200. In some embodiments, chip 200 is to be formed as an image sensor chip, which includes photo diodes therein. Accordingly, chip 200 may include pixel array region 202. In alternative embodiments, chip 200 is a logic device chip which does not include image sensors therein. Accordingly, chip 200 does not include pixel array region 202. Chip 200 may further include logic device region 204 in some embodiments.

Photo resist 22 is coated on the front surface 20A of semiconductor substrate 20, and is then patterned to form openings 24, which includes openings 24A in scribe line region 100 and 24B in chip region 200. In some embodiments, openings 24A have widths W1, which is greater than width W2 of openings 24B. For example, ratio W1/W2 may be greater than about 5 or greater. In some exemplary embodiments, photo resist 22 is a negative photo resist. In alternative embodiments, photo resist is a positive resist. The formation of photo resist 22 includes exposing some portions of photo resist 22 to light, wherein a photolithography mask (not shown) that includes opaque and transparent patterns are used to expose photo resist 22. When being the negative photo resist, the portions of photo resist 22 exposed to light remain after the development, while the portions not exposed to light are removed after the development. Conversely, when being the positive photo resist, the portions of photo resist 22 exposed to light are removed after the development, while the portions not exposed to light remain after the development.

Figure 2:
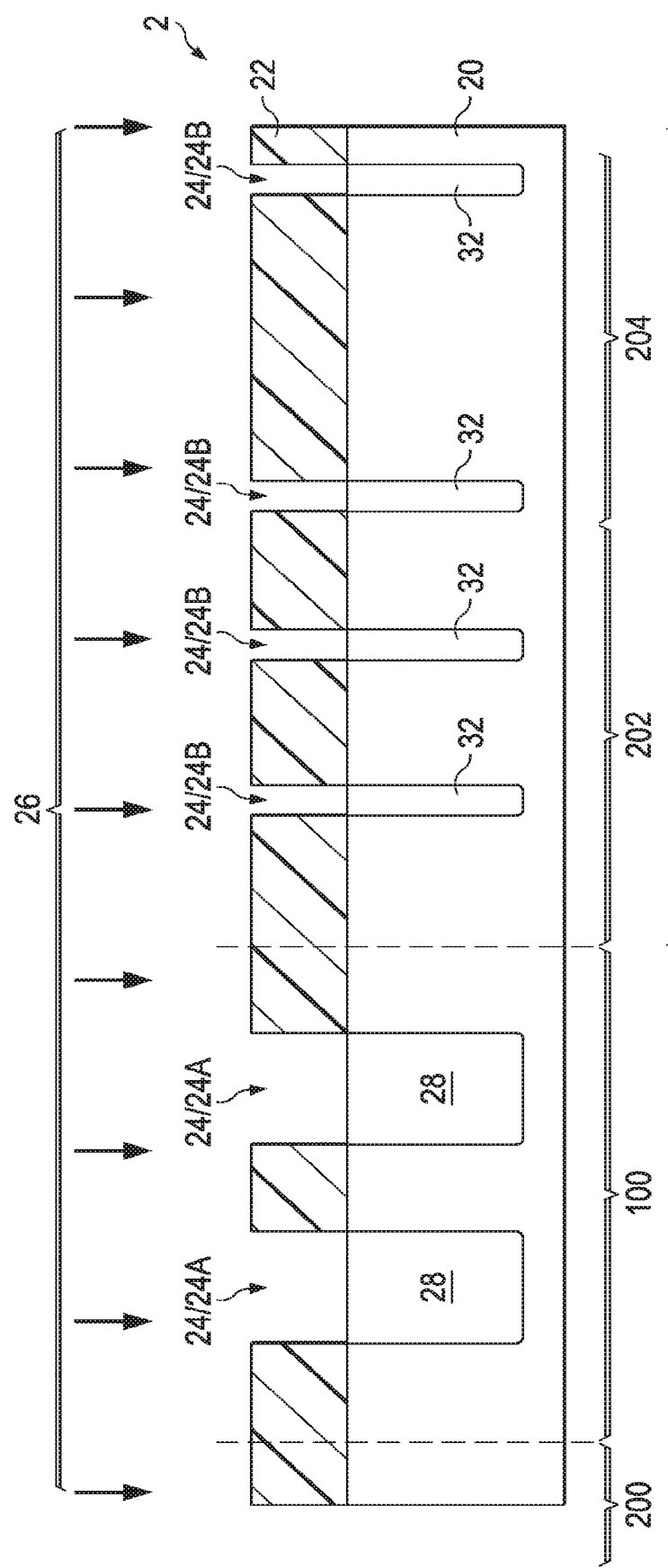

Next, referring to FIG. 2, an implantation 26 is performed to form implanted regions 28 and DI regions 32 in substrate 20. In some embodiments, the implanted impurity is a p-type impurity that, for example, comprises boron, indium, and/or the like. In alternative embodiments, the implanted impurity is an n-type impurity, for example, comprising phosphorous, arsenic, antimony, and/or the like. The impurity concentration of implanted regions 28 and DI regions 32 may be in the range between about $10^{16}/cm^3$ and about $10^{17}/cm^3$. In alternative embodiments, the impurity concentration of implanted regions 28 and DI regions 32 are higher than about $10^{17}/cm^3$ or lower than about $10^{16}/cm^3$. In some exemplary embodiments, the DI regions 32 in pixel array region 202 form a grid in the top view of wafer 2, wherein image sensors are formed in the grid in subsequent process steps.

Figure 3:
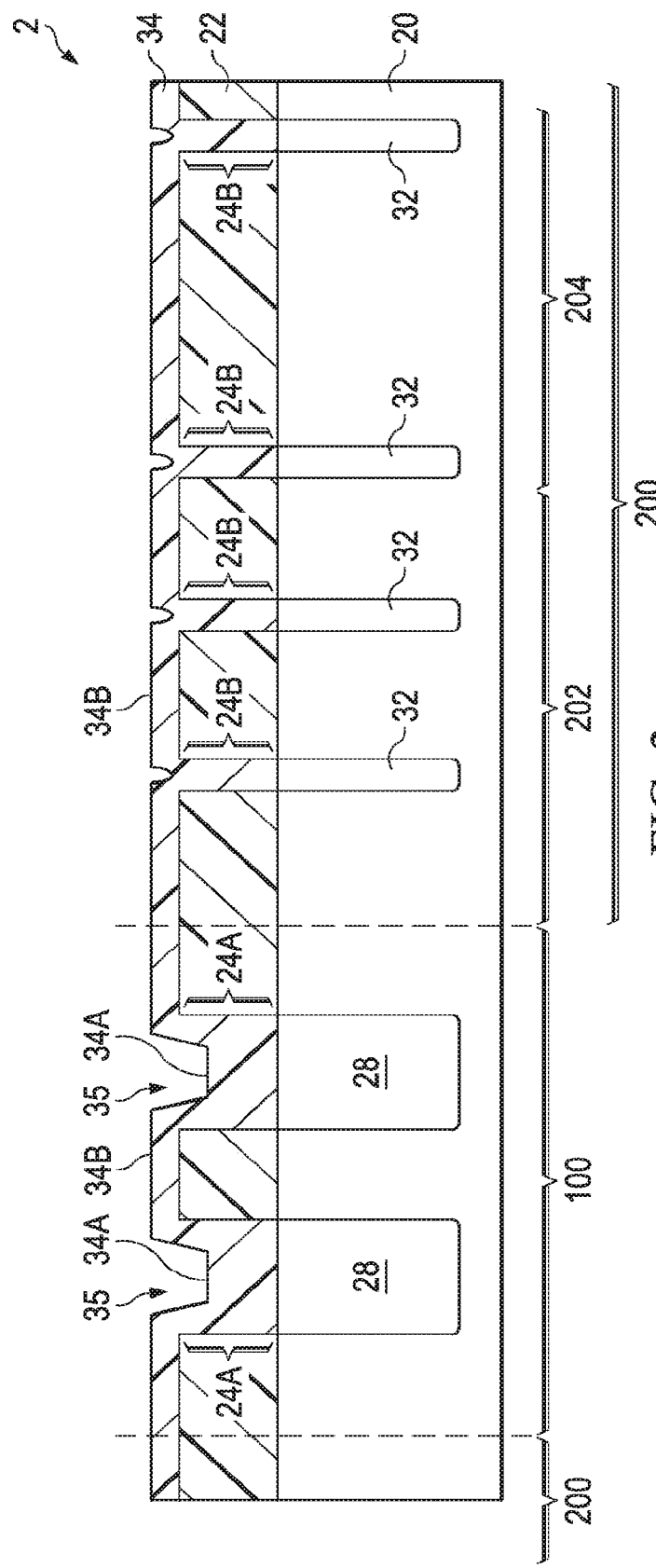

Next, referring to FIG. 3, coating layer 34 is formed over photo resist 22. In the embodiments in which photo resist 22 is a negative photo resist, coating layer 34 may also be a negative photo resist. In these embodiments, since photo resist 22 has already had cross-linking, it will not be dissolved by the solvent in photo resist 22. In alternative embodiments, coating layer 34 may also include another non-photo-resist coating material such as Bottom Anti-Reflective Coating (BARC), plug materials, or the like. In the embodiments in which photo resist 22 is a positive photo resist, coating layer 34 may include the non-photo-resist coating material. The coating material and the formation process of coating layer 34 are selected so that recesses 35 are formed in coating layer 34. The portions of coating layer 34 in openings 24A has a top surface 34A lower than top surface 34B, which is the top surface of the portions of coating layer 34 over photo resist 22.

In the embodiments in which coating layer 34 is a photo resist, it is baked after being coated. No light exposure, however, is performed on photo resist 34 in accordance with some embodiments. In alternative embodiments, a blanket light-exposure is performed on photo resist 34, wherein during the blanket light-exposure, either no photolithography mask is used, or a blanket photolithography mask that does not have patterns thereon is used.

Figure 4:
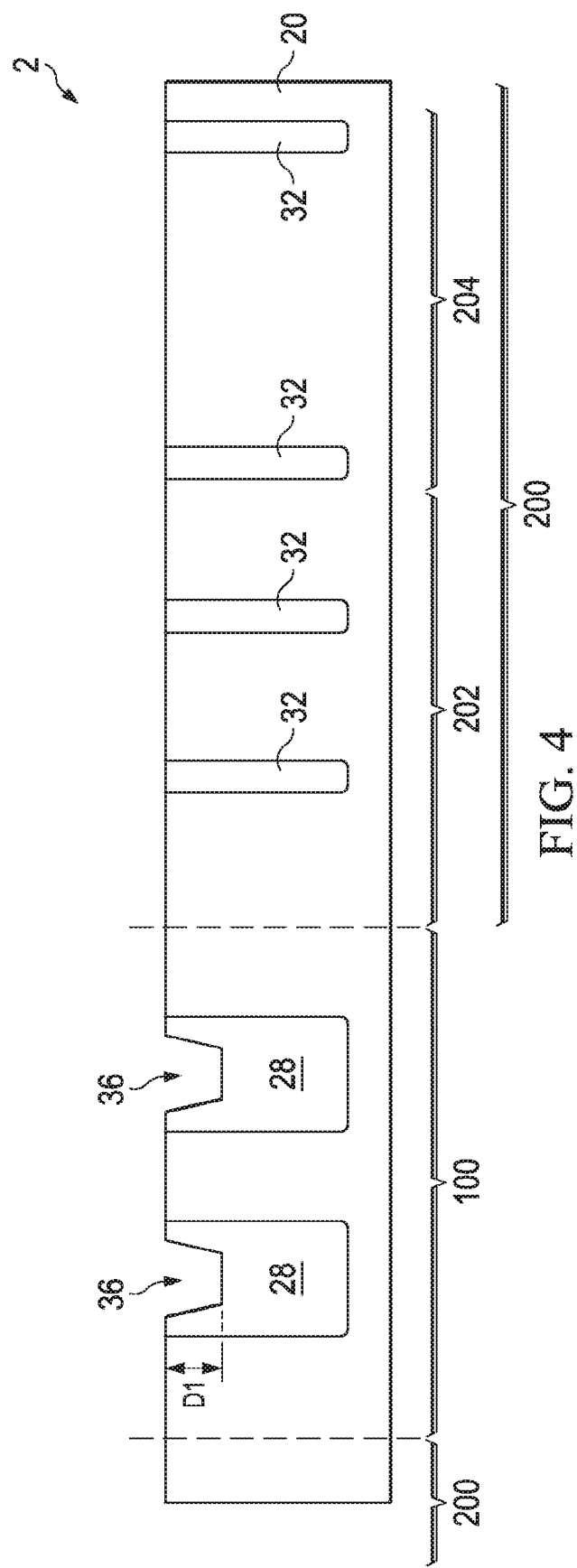

Next, an etching process is performed to etch coating layer 34, photo resist 22, and the underlying implanted regions 28, resulting in the structure in FIG. 4. Coating layer 34 and photo resist 22 are fully removed after the etching, and openings 36 are formed in implanted regions 28. In accordance with some embodiments, the etching is anisotropic, and the topography of the top surface of coating layer 34 is transferred down into substrate 20. The etchant gas may be selected to attack coating layer 34, photo resist 22, and substrate 20 with no significant etching selectivity. In accordance with some embodiments in which coating layer 34 is a negative photo resist, the etchant gas may include $O_2$ or $CF_4$, for example. In alternative embodiments in which coating layer 34 comprises a non-photo-resist material such as BARC (which comprise silicon oxynitride or other known BARC materials), the etchant gas may include $O_2$ or $CF_4$. In alternative embodiments, the etching is a wet etching or a combination of a dry etching and a wet etching.

At the same time openings 36 are formed, no openings are formed in DI regions 32 since DI regions 32 are much narrower than implanted regions 28.

In accordance with some embodiments, assuming the etching rate of coating layer 34 is ER34, the etching rate of photo resist 22 is ER22, and the etching rate of implanted regions 28 is ER28, then the ratios of ER34/ER28, ER34/ER22, and ER22/ER28 may be in the similar range, which may be between about ¼ and about 4, or between about ½ and about 2, for example. By making the etching rates ER34, ER28, and ER22 to be close to each other, the topography of the top surface of coating layer 34 is transferred down into implanted regions 28, while the depths of openings 36 are not excessively high or low. Throughout the description, openings 36 are referred to as alignment marks since they are used for aligning in subsequent process steps. In accordance with some embodiments, openings 36 have depth D1 between about 0.02 μm and about 0.2 μm.

Figure 5:
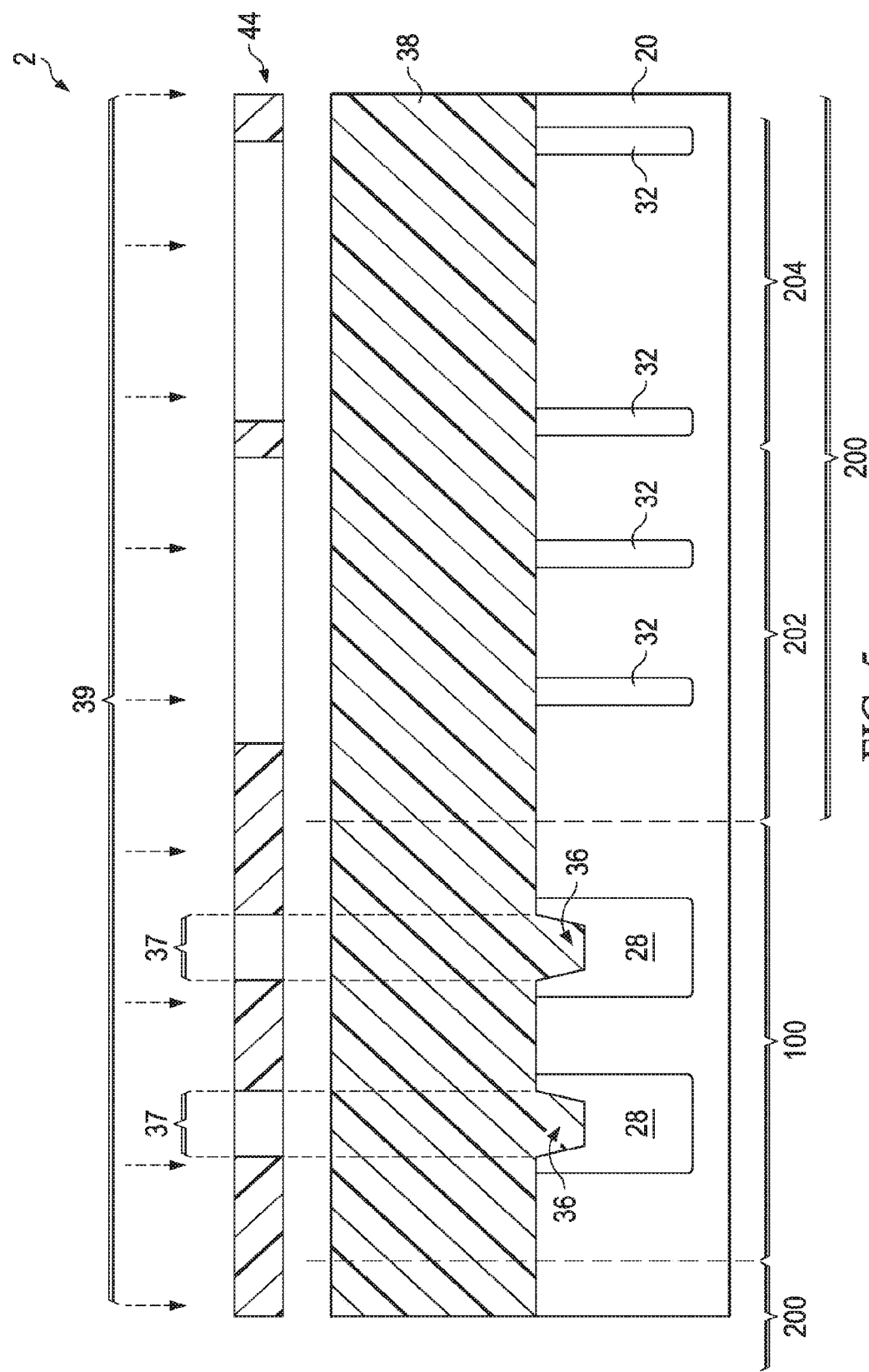

FIG. 5 illustrates the coating and the exposure of photo resist 38. Photo resist 38 is first coated, and is then exposed to light 39 through photolithography mask 44, which includes opaque patterns for blocking light 39 and transparent patterns for allowing light 39 to pass through. The light exposure is performed using alignment marks 36 to align photolithography mask 44, so that the subsequently formed well regions 40 (FIG. 6) are aligned to desirable positions accurately. For example, photolithography mask 44 may have alignment marks 37 that are aligned to the respective alignment marks 36. After the light exposure, photo resist 38 is developed, resulting in the pattern as in FIG. 6.

Figure 6:
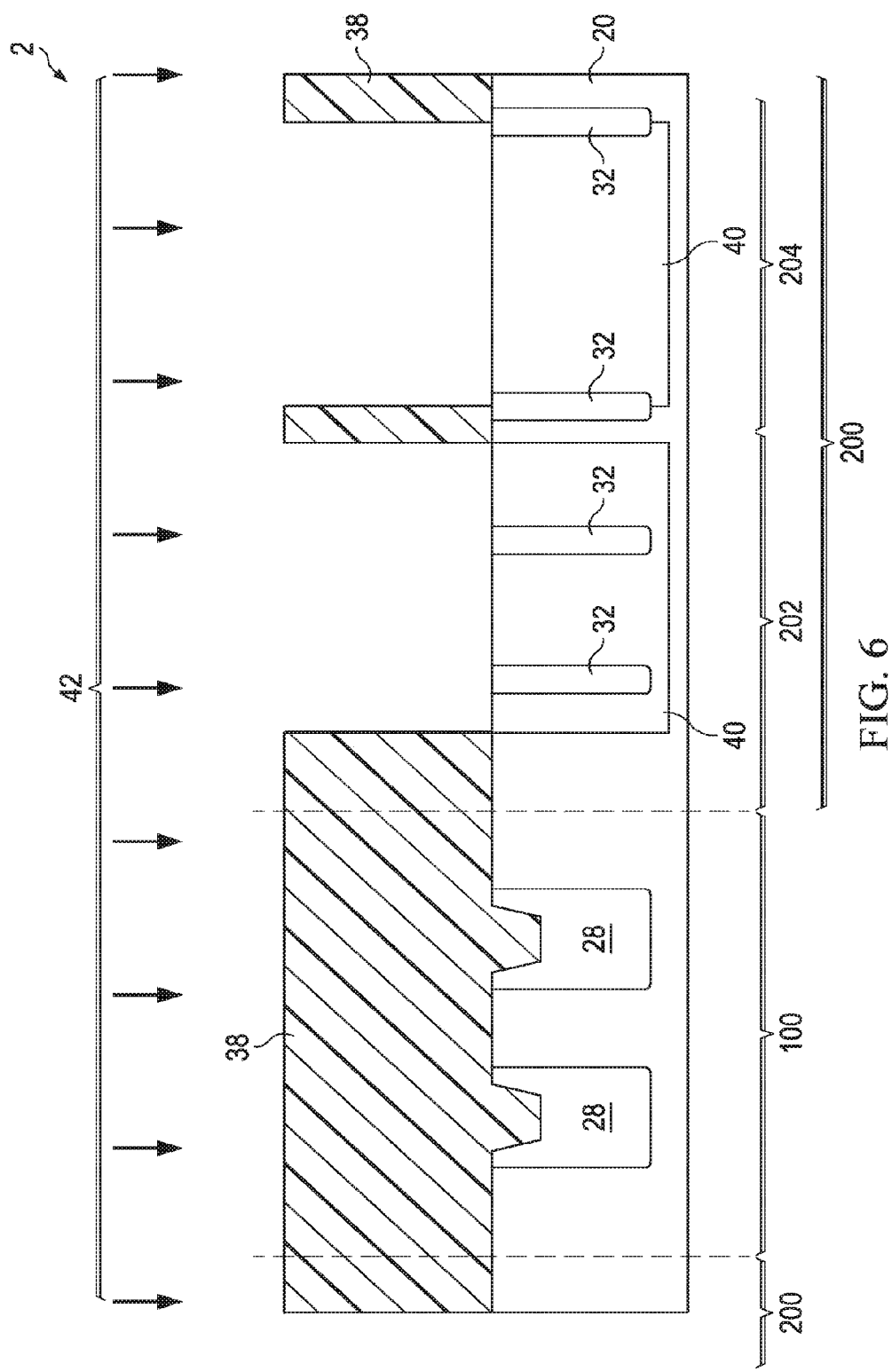

FIG. 6 illustrates the formation of well regions 40 through implantation 42. In some embodiments, the implanted well regions 40 have the same conductivity type as the DI regions 32. Accordingly, well regions 40 may be p-type or n-type, depending on the conductivity type of DI regions 32. Well regions 40 join DI regions 32. In some embodiments, well regions 40 have an impurity concentration between about $10^{16}/cm^3$ and about $10^{17}/cm^3$. Well regions 40 may extend to a depth deeper than, level with, or shallower than DI regions 32. In alternative embodiments, well regions 40 and DI regions 32 have substantially the same depth.

Figure 7:
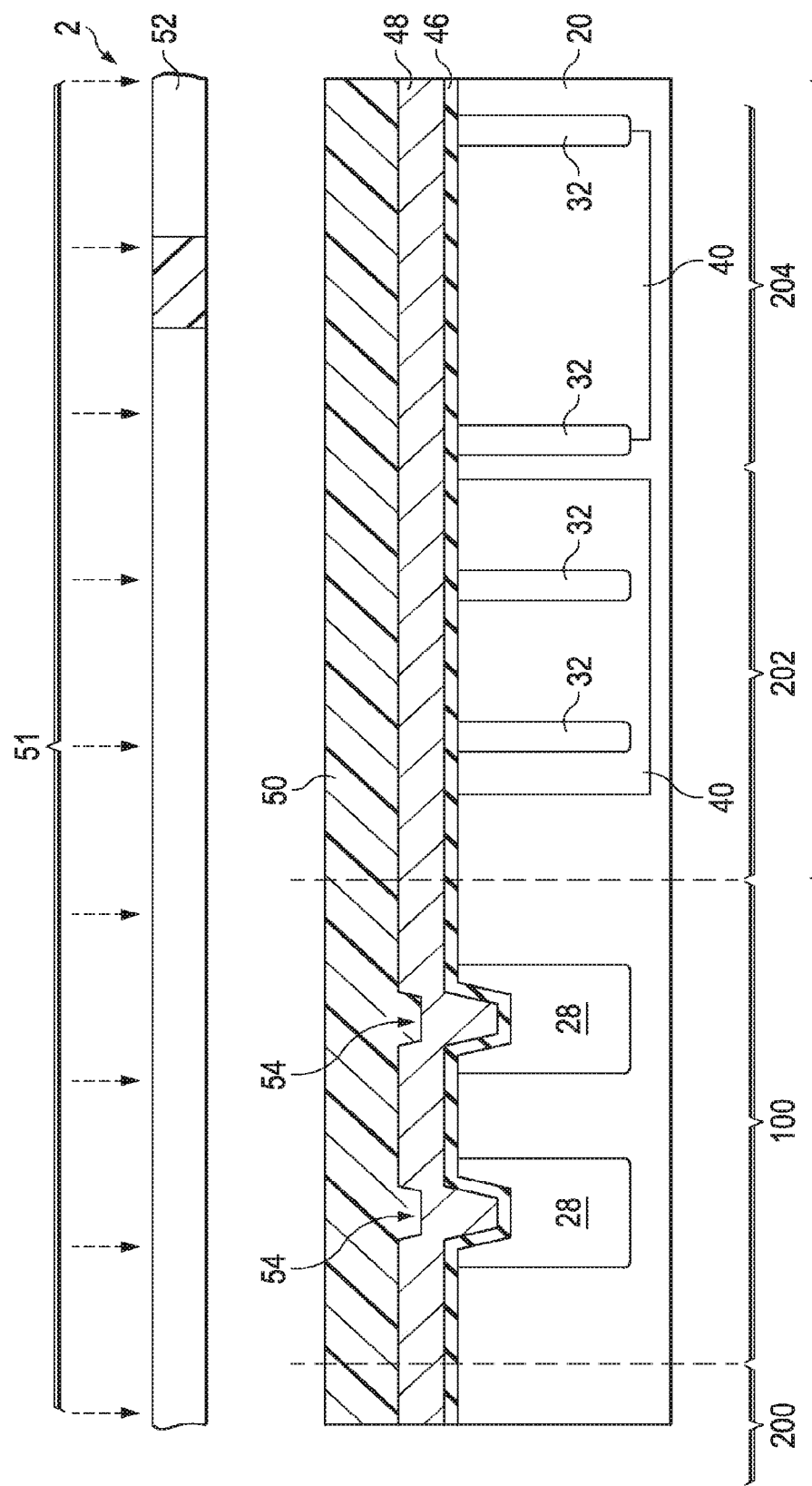
Figure 8:
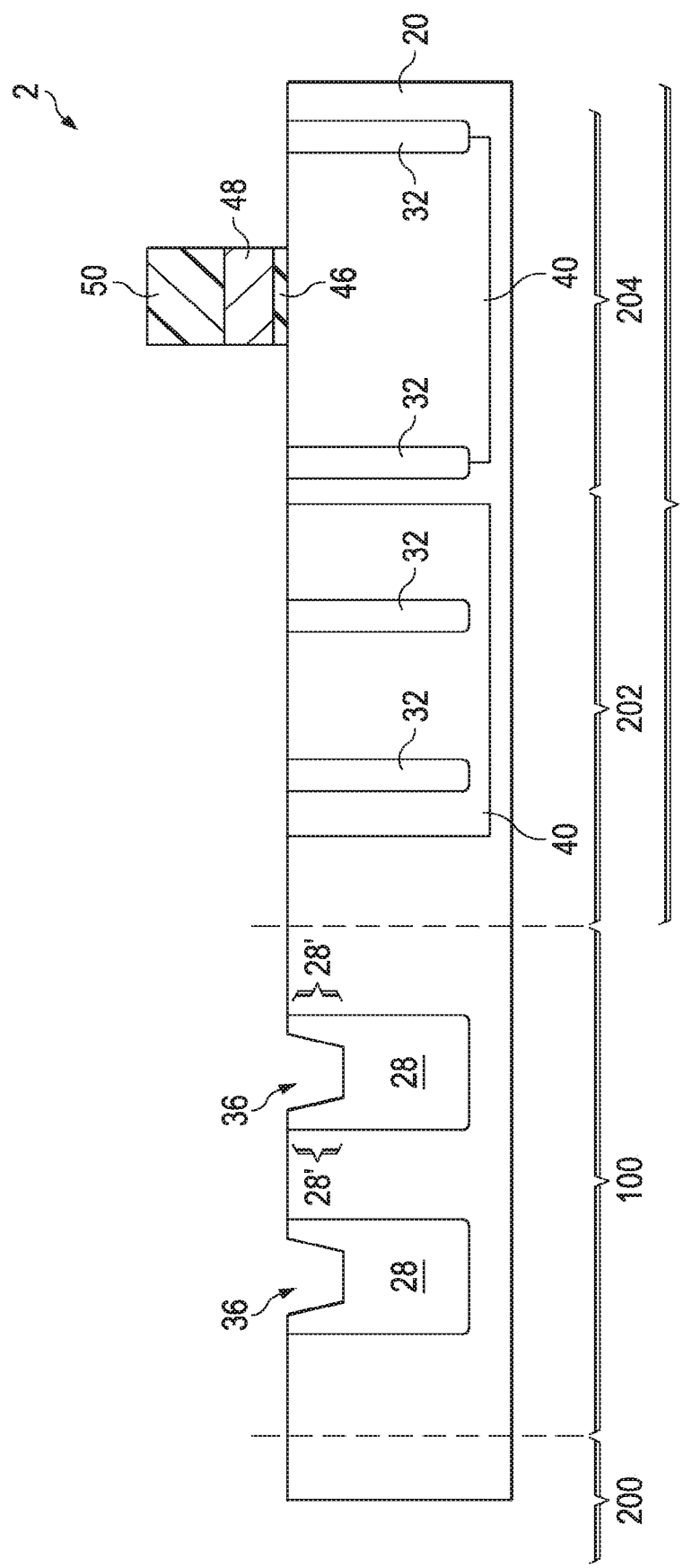

FIGS. 7 and 8 illustrate the formation of a gate stack in logic device region 204. In some embodiments, as shown in FIG. 7, gate dielectric layer 46 and gate electrode layer 48 are formed on wafer 2. Gate dielectric layer 46 may include silicon oxide, silicon nitride, silicon oxynitride, or a high-k dielectric material such as hafnium oxide, lanthanum oxide, or aluminum oxide.

Next, as also shown in FIG. 7, photo resist 50 is coated over gate electrode layer 48. Photo resist 50 is exposed to light 51 through photolithography mask 52, which is aligned to wafer 2 using alignment marks 36. In some embodiments, gate dielectric layer 46 and gate electrode layer 48 are transparent, so that alignment marks 36 can be seen through gate dielectric layer 46 and gate electrode layer 48. In alternative embodiments, the top surface of gate electrode layer 48 follows the topology of substrate 20, so that openings 54 are formed in gate electrode layer 48. Openings 54 are aligned to alignment marks 36, and hence can be used as alignment marks for aligning the exposure of photo resist 50. Accordingly, even if gate electrode layer 48 and/or gate dielectric layer 46 are not transparent, the light-exposure of photo resist 50 may also use alignment marks 36. The exposed photo resist 50 is then developed, resulting in the pattern in FIG. 8.

As also shown in FIG. 8, gate dielectric 46 and gate electrode layer 48 are patterned using the patterned photo resist 50 as an etching mask. Next, photo resist 50 is removed, as shown in FIG. 9. In subsequent process steps, lightly doped source and drain regions 56, heavily doped source and drain regions 58, gate spacers 60, and silicide regions 61 are formed to form transistor 206. The sidewalls of source and drain regions 56 contact DI regions 32, so that DI regions 32 act as isolation regions to isolation transistor 206. Source and drain regions 56 have a conductivity type opposite to the conductivity type of implanted regions 28, so that a P-N Junction is formed at the interface between source and drain regions 58 and the adjoining DI regions 32. Furthermore, contact etch stop layer 62 and Inter-Layer Dielectric (ILD) 64 are formed over transistor 206. Contact plugs 68 are also formed to connect to transistor 206. Contact etch stop layer 62 and ILD 64 may be filled in openings 36 in some embodiments. In alternative embodiments, other materials/layers are filled in openings 36. The filling material of openings 36 may be transparent in some embodiments.

As also shown in FIG. 9, image sensors 208, which may be photo diodes, are formed in image sensor region 202, wherein DI regions 32 act as the isolation regions to isolate image sensors 208. In FIG. 9, no Shallow Trench Isolation (STI) regions, which are dielectric regions, are used to isolate devices. In some exemplary embodiments, throughout wafer 2, there is no STI regions, wherein DI regions replace the STI regions.

FIG. 10 illustrates a top view of wafer 2, wherein alignment marks 36 are formed in scribe lines 100. Each of dashed regions 70 represents a field that includes a plurality of chips 200 therein, wherein the light-exposure for forming features on wafer 2 is performed field-by-field. Accordingly, alignment marks 36 are at the same positions of the respective field 70. In alternative embodiments, alignment marks 36 are formed in chips 200, as also shown in one of chips 200. In these embodiments, alignment marks 36 may be formed in all chips 200, although a single one is illustrated in FIG. 10.

Figure 11C:
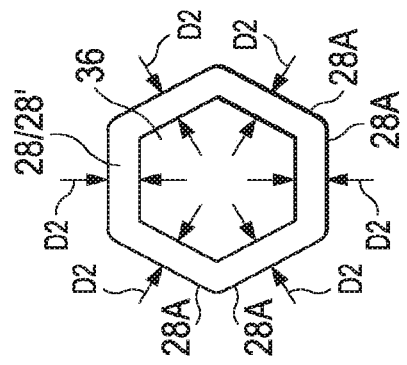
FIGS. 11A-11C illustrate the top views of some exemplary alignment marks.
Figure 11B:
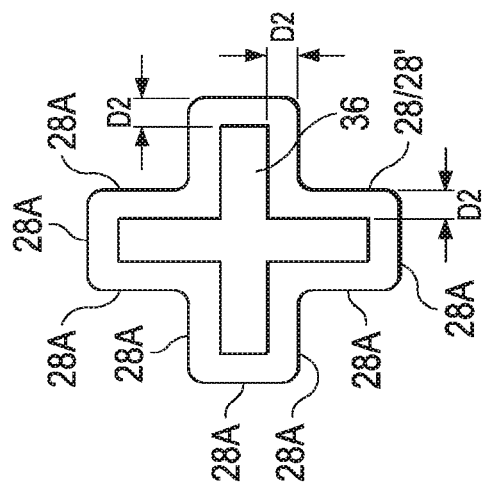
Figure 11A:
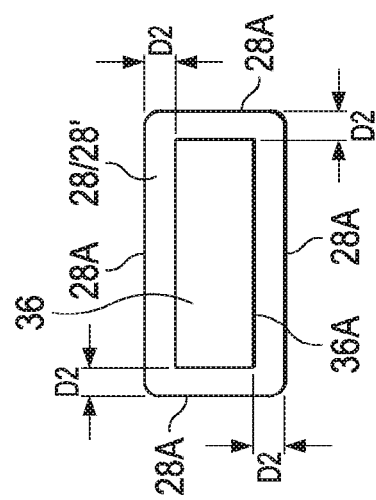

FIGS. 11A, 11B, and 11C illustrate the top views of some exemplary alignment marks and the respective implanted regions 28. Since the formation of alignment marks 36 are self-aligned to implanted regions 28, implanted regions 28 include portions 28' (refer to FIG. 8) forming a full ring encircling the respective alignment marks 36, and a portion under the respective alignment mark 36. Furthermore, the ring 28' may have a uniform width D2. Alternatively stated, edges 36A of the openings 36 have substantially a uniform distance D2 from the respective closest edges 28A of the implanted region 28. Implanted regions 28 may have different shapes including, and not limited to, circles, rectangles, crosses, polygons, ellipses, or any other shapes. The shapes of alignment marks 36 may have the shapes (although smaller lateral dimensions) similar to the shapes of the respective implanted regions 28. In the final structure, implanted regions 28 are not used as well regions or isolation regions for forming active devices such as transistors, diodes, or the like.

The embodiments of the present disclosure have some advantageous features. In the embodiments of the present disclosure, the formation of the alignment marks share the process for forming the DI regions. These alignment marks thus replace the conventional alignment marks that are formed of STI regions. Furthermore, the alignment marks in accordance with the embodiments of the present disclosure are self-aligned to the DI regions.

In accordance with some embodiments, a method includes forming a photo resist over a semiconductor substrate of a wafer, patterning the photo resist to form a first opening in the photo resist, and implanting the semiconductor substrate using the photo resist as an implantation mask. An implanted region is formed in the semiconductor substrate, wherein the implanted region is overlapped by the first opening. A coating layer is coated over the photo resist, wherein the coating layer includes a first portion in the first opening, and a second portion over the photo resist. A top surface of the first portion is lower than a top surface of the second portion. The coating layer, the photo resist, and the implanted region are etched to form a second opening in the implanted region.

In accordance with other embodiments, a method includes forming a first negative photo resist over a semiconductor substrate of a wafer, and patterning the first negative photo resist to form a first opening in a scribe line region of the first negative photo resist, and a second opening in a chip region of the wafer. The semiconductor substrate is implanted using the first negative photo resist as an implantation mask, wherein an implanted region is formed in the semiconductor substrate and overlapped by the first opening, and a Device Isolation (DI) region is formed in the semiconductor substrate and overlapped by the second opening. A second negative photo resist is coated over the negative photo resist, wherein the second negative photo resist has a recess. The second negative photo resist, the first negative photo resist, and the implanted region are etched to form an alignment mark in the implanted region, wherein no opening is formed in the recess by the etching.

In accordance with yet other embodiments, a device includes a wafer including a plurality of chips, and a scribe line in the wafer, wherein the scribe line separates a first row of the plurality of chips from a second row of the plurality of chips. An implanted region extends from a top surface of a semiconductor substrate of the wafer into the semiconductor substrate, wherein the implanted region includes a p-type or an n-type impurity. An opening extends from a top surface of the implanted region to an intermediate level of the implanted region, wherein the implanted region includes portions forming a full ring encircling the opening.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a wafer comprising a plurality of chips;
   a scribe line in the wafer, wherein the scribe line separates a first row of the plurality of chips from a second row of the plurality of chips;
   an implanted region extending from a top surface of a semiconductor substrate of the wafer into the semiconductor substrate, wherein the implanted region comprises a p-type or an n-type impurity;
   an opening extending from a top surface of the implanted region to an intermediate level of the implanted region, wherein the implanted region comprises portions forming a full ring encircling the opening; and an etch stop layer over the semiconductor substrate, wherein the etch stop layer extends into the opening.

2. The integrated circuit structure of claim 1, wherein the full ring has a substantially uniform width.

3. The integrated circuit structure of claim 1 further comprising an implanted Device Isolation (DI) region in one of the plurality of chips, wherein the implanted DI region comprises a same impurity as the implanted region, and wherein the implanted DI region forms a grid.

4. The integrated circuit structure of claim 1 further comprising;
an implanted Device Isolation (DI) region, wherein the implanted DI region comprises a same impurity as the implanted region; and
a transistor comprising a source/drain region, wherein an edge of the source/drain region contacts the implanted DI region, and wherein the source/drain region has a conductivity type opposite to a conductivity type of the implanted DI region.

5. The integrated circuit structure of claim 4, wherein the transistor comprises:
a gate dielectric over the semiconductor substrate; and
a gate electrode over the gate dielectric, wherein the gate dielectric and the gate electrode are in combination configured to allow the opening to be visible through the gate dielectric and the gate electrode.

6. The integrated circuit structure of claim 1, wherein no active device is formed at a surface of the implanted region.

7. The integrated circuit structure of claim 1, wherein the implanted region has an impurity concentration in a range between about $10^{16}/cm^3$ and about $10^{17}/cm^3$.

8. The integrated circuit structure of claim 1 further comprising an Inter-Layer Dielectric (ILD) over the etch stop layer, wherein the ILD extends into the opening.

9. An integrated circuit structure comprising:
a semiconductor substrate;
an implanted region in the semiconductor substrate, wherein the implanted region comprises a p-type or an n-type impurity;
an opening extending into the implanted region, wherein the implanted region extends from the opening outwardly in a direction parallel to a major top surface of the semiconductor substrate;
an etch stop layer over the semiconductor substrate, wherein the etch stop layer extends into the opening; and
an Inter-Layer Dielectric (ILD) over the etch stop layer, wherein the ILD further extends into the opening.

10. The integrated circuit structure of claim 9, wherein the implanted region has a bottom surface in contact with a top surface of the semiconductor substrate, and the bottom surface comprises:
a first portion overlapped by the opening; and
a second portion vertically misaligned from the opening, wherein the first portion and the second portion are substantially coplanar with each other.

11. The integrated circuit structure of claim 9, wherein the implanted region comprises a top surface in contact with the etch stop layer, wherein the top surface of the implanted region forms a ring encircling the opening, and the ring has a substantially uniform width.

12. The integrated circuit structure of claim 9 further comprising an implanted Device Isolation (DI) region extending into the semiconductor substrate, wherein the implanted DI region comprises a same impurity as the implanted region, and the implanted DI region forms a grid.

13. The integrated circuit structure of claim 12 further comprising a well region comprising a portion encircling the implanted DI region, wherein the well region and the implanted DI region has a same conductivity type, and a first impurity concentration of the implanted DI region is higher than a second impurity concentration of the well region.

14. The integrated circuit structure of claim 13, wherein the first impurity concentration is substantially equal to the second impurity concentration and a third impurity concentration of the implanted region.

15. The integrated circuit structure of claim 12 further comprising a transistor comprising a source/drain region, wherein an edge of the source/drain region contacts the implanted DI region, and wherein the source/drain region has a conductivity type opposite to a conductivity type of the implanted DI region.

16. The integrated circuit structure of claim 15, wherein the transistor comprises:
a gate dielectric over the semiconductor substrate; and
a gate electrode over the gate dielectric, wherein the gate dielectric and the gate electrode are in combination configured to allow the opening to be visible through the gate dielectric and the gate electrode.

17. An integrated circuit structure comprising:
a semiconductor substrate;
an implanted region extending from a top surface of the semiconductor substrate into the semiconductor substrate;
an opening extending from the top surface of the semiconductor substrate into the implanted region, wherein the implanted region comprises a first portion directly underlying the opening, and second portions on opposite sides of, and at a same level as, the opening;
a transistor comprising a gate stack over the semiconductor substrate;
an etch stop layer over the semiconductor substrate, wherein the etch stop layer comprises a first portion over and in contact with the gate stack, and a second portion extending into the opening; and
an Inter-Layer Dielectric (ILD) over the etch stop layer, wherein the ILD further extends into the opening.

18. The integrated circuit structure of claim 17, wherein the second portions of the implanted region are portions of a ring formed of the implanted region, with the ring at a same level as the opening.

19. The integrated circuit structure of claim 17, wherein the opening and the implanted region are in a scribe line of a wafer.

20. The integrated circuit structure of claim 17, wherein the etch stop layer is formed of a dielectric material.

* * * * *